United States Patent
Niwa et al.

(10) Patent No.: US 11,217,728 B2
(45) Date of Patent: Jan. 4, 2022

(54) SEMICONDUCTOR LIGHT EMITTING ELEMENT AND METHOD OF MANUFACTURING SEMICONDUCTOR LIGHT EMITTING ELEMENT

(71) Applicant: NIKKISO CO., LTD., Tokyo (JP)

(72) Inventors: Noritaka Niwa, Hakusan Ishikawa (JP); Tetsuhiko Inazu, Hakusan Ishikawa (JP)

(73) Assignee: NIKKISO CO., LTD., Tokyo (JP)

(*) Notice: Subject to any disclaimer, the term of this patent is extended or adjusted under 35 U.S.C. 154(b) by 0 days.

(21) Appl. No.: 16/668,335

(22) Filed: Oct. 30, 2019

(65) Prior Publication Data

US 2020/0066941 A1 Feb. 27, 2020

Related U.S. Application Data

(63) Continuation of application No. PCT/JP2019/019775, filed on May 17, 2019.

(30) Foreign Application Priority Data

May 29, 2018 (JP) ............................... JP2018-102460

(51) Int. Cl.
*H01L 33/46* (2010.01)
*H01L 33/00* (2010.01)
*H01L 33/14* (2010.01)
(Continued)

(52) U.S. Cl.
CPC ............ *H01L 33/46* (2013.01); *H01L 33/007* (2013.01); *H01L 33/145* (2013.01); *H01L 33/24* (2013.01);
(Continued)

(58) Field of Classification Search
CPC ..................................................... H01L 33/46
(Continued)

(56) References Cited

U.S. PATENT DOCUMENTS

2004/0051105 A1* 3/2004 Tsuda .................. B82Y 20/00
257/79
2012/0043575 A1* 2/2012 Kim .................... H01L 33/46
257/98
(Continued)

FOREIGN PATENT DOCUMENTS

JP 2001339121 A 12/2001
JP 2009164423 A 7/2009
JP 2012028381 A 2/2012
(Continued)

OTHER PUBLICATIONS

International Preliminary Report on Patentability dated Dec. 1, 2020 in PCT/JP2019/019775 (8 pages).
(Continued)

*Primary Examiner* — Hsin Yi Hsieh
(74) *Attorney, Agent, or Firm* — Muncy, Geissler, Olds & Lowe, P.C.

(57) ABSTRACT

A semiconductor light emitting element includes: an n-type semiconductor layer provided on a substrate; an active layer provided in a first region of the n-type semiconductor layer and made of an AlGaN-based semiconductor material; a p-type semiconductor layer provided on the active layer; a first protective layer provided on the p-type semiconductor layer and made of silicon oxide ($SiO_2$) or silicon oxynitride (SiON); a second protective layer provided to cover a top of the first protective layer, a second region on the n-type semiconductor layer different from the first region, and a lateral surface of the active layer and made of aluminum oxide ($Al_2O_3$), aluminum oxynitride (AlON), or aluminum nitride (AlN); a p-side electrode provided contiguously on the p-type semiconductor layer; and an n-side electrode provided contiguously on the n-type semiconductor layer.

7 Claims, 6 Drawing Sheets

(51) Int. Cl.
  *H01L 33/24* (2010.01)
  *H01L 33/32* (2010.01)
  *H01L 33/40* (2010.01)

(52) U.S. Cl.
  CPC ............ *H01L 33/32* (2013.01); *H01L 33/405* (2013.01); *H01L 2933/0016* (2013.01); *H01L 2933/0025* (2013.01)

(58) Field of Classification Search
  USPC .......................................................... 257/98
  See application file for complete search history.

(56) References Cited

U.S. PATENT DOCUMENTS

| | | | |
|---|---|---|---|
| 2014/0291714 A1* | 10/2014 | Jeon | ........................ H01L 33/50 257/98 |
| 2017/0263816 A1 | 9/2017 | Yang et al. | |
| 2017/0263817 A1 | 9/2017 | Hirano et al. | |

FOREIGN PATENT DOCUMENTS

| | | |
|---|---|---|
| JP | 2015023073 A | 2/2015 |
| JP | 2015082612 A | 4/2015 |
| JP | 5985782 B1 | 9/2016 |
| WO | WO-2011/135888 A1 | 11/2011 |

OTHER PUBLICATIONS

Office Action dated Nov. 16, 2021 in JP Application No. 2019-138943, 5 pages.

* cited by examiner

SEMICONDUCTOR LIGHT EMITTING ELEMENT AND METHOD OF MANUFACTURING SEMICONDUCTOR LIGHT EMITTING ELEMENT

CROSS REFERENCE TO RELATED APPLICATIONS

This application is a Continuation of co-pending Application No. PCT/JP2019/019775, filed on May 17, 2019, for which priority is claimed under 35 U.S.C. § 120; and this application claims priority of Application No. 2018-102460 filed in Japan on May 29, 2018 under 35 U.S.C. § 119; the entire contents of all of which are hereby incorporated by reference.

BACKGROUND OF THE INVENTION

1. Field of the Invention

The present invention relates to a semiconductor light emitting element and a method of manufacturing a semiconductor light emitting element.

2. Description of the Related Art

A light emitting element for emitting deep ultraviolet light includes an aluminum gallium nitride (AlGaN) based n-type clad layer, an active layer, and a p-type clad layer stacked successively on a substrate. An n-side electrode is formed on a partial region of the n-type clad layer exposed by etching, and a p-side electrode is formed on the p-type clad layer. A protective insulation film of silicon oxide ($SiO_2$), aluminum oxide ($Al_2O_3$), or the like is provided on the exposed surface of the n-type clad layer, the active layer, and the p-type clad layer.

Silicon oxide ($SiO_2$) is a material of a poor moisture resistance. It is therefore necessary to secure a large thickness in order to provide the material with a suitable protective function. Meanwhile, aluminum oxide ($Al_2O_3$) has an excellent moisture resistance but is difficult to etch. Therefore, a semiconductor layer may be damaged in the process of removing the protective layer to form an opening for the electrode. As a result, the output characteristics of the element may become poor.

SUMMARY OF THE INVENTION

The present invention addresses the above-described issue, and an illustrative purpose thereof is to improve the reliability and output characteristics of a semiconductor light emitting element.

A semiconductor light emitting element according to an embodiment of the present invention includes: an n-type semiconductor layer provided on a substrate and made of an n-type aluminum gallium nitride (AlGaN)-based semiconductor material; an active layer provided in a first region on the n-type semiconductor layer and made of an AlGaN-based semiconductor material; a p-type semiconductor layer provided on the active layer and made of a p-type AlGaN-based semiconductor material; a first protective layer provided on the p-type semiconductor layer and made of silicon oxide ($SiO_2$) or silicon oxynitride (SiON); a second protective layer provided to cover a top of the first protective layer, a second region on the n-type semiconductor layer different from the first region, and a lateral surface of the active layer and made of aluminum oxide ($Al_2O$), aluminum oxynitride (AlON), or aluminum nitride (AlN); a p-side electrode provided contiguously on the p-type semiconductor layer in a p-side opening that extends through the first protective layer and the second protective layer on the p-type semiconductor layer; and an n-side electrode provided contiguously on the n-type semiconductor layer in an n-side opening that extends through the second protective layer in the second region on the n-type semiconductor layer.

According to this embodiment, providing the first protective layer of a low refractive index made of silicon oxide ($SiO_2$) or silicon oxynitride (SiON) on the p-type semiconductor layer ensures that more ultraviolet light is totally reflected at the interface between the p-type semiconductor layer and the first protective layer. This allows more ultraviolet light to be totally reflected and guided toward the substrate having a light extraction surface and increases the external quantum efficiency. Further, by covering the lateral surface of the active layer with the second protective layer made of aluminum oxide ($Al_2O$) or aluminum nitride (AlN), the moisture resistance is improved.

The second protective layer may be provided to further cover lateral surfaces of the n-type semiconductor layer and the p-type semiconductor layer.

A thickness of the second protective layer may be 50 nm or smaller.

A portion of each of the n-side electrode and the p-side electrode may be provided on the second protective layer.

Another embodiment of the present invention relates to a method of manufacturing a semiconductor light emitting element. The method includes: stacking an n-type semiconductor layer made of an n-type aluminum gallium nitride (AlGaN)-based semiconductor material, an active layer provided on the n-type semiconductor layer and made of an AlGaN-based semiconductor material, a p-type semiconductor layer provided on the active layer and made of a p-type AlGaN-based semiconductor material, and a first protective layer provided on the p-type semiconductor layer and made of silicon oxide ($SiO_2$) or silicon oxynitride (SiON) successively on a substrate; removing a portion of each of the first protective layer, the p-type semiconductor layer, the active layer, and the n-type semiconductor layer so as to expose a portion of the n-type semiconductor layer; forming a second protective layer made of aluminum oxide ($Al_2O$), aluminum oxynitride (AlON), or aluminum nitride (AlN) so as to cover a top of the first protective layer, an exposed region on the n-type semiconductor layer, and a lateral surface of the active layer; forming a p-side opening in which the first protective layer is exposed by removing the second protective layer on the first protective layer in part, and forming an n-side opening in which the n-type semiconductor layer is exposed by removing the second protective layer on the n-type semiconductor layer in part; forming an n-side electrode contiguously on the n-type semiconductor layer in the n-side opening; exposing the p-type semiconductor layer by removing the first protective layer in the p-side opening; and forming a p-side electrode contiguous with the p-type semiconductor layer in the p-side opening.

According to this embodiment, the n-side opening and the p-side opening is formed by removing the second protective layer made of a hard-to-etch material like aluminum oxide ($Al_2O_3$), aluminum oxynitride (AlON), or aluminum nitride (AlN), while also protecting the p-type semiconductor layer with the first protective layer. As a result, the portion contiguous with the p-side electrode on the p-type semiconductor layer is inhibited from being damaged by etching and the contact resistance of the p-side electrode is prevented from being degraded. Further, by covering the lateral surface of the active layer with the second protective layer made of aluminum oxide (Al$_2$O$_3$) or aluminum nitride (AlN), the moisture resistance is improved.

The forming of the p-side opening and the n-side opening may include removing the second protective layer by dry etching. The exposing of the p-type semiconductor layer may include removing the first protective layer by wet etching.

The second protective layer may be formed by using atomic layer deposition method.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which.

DETAILED DESCRIPTION OF THE INVENTION

Figure 1:
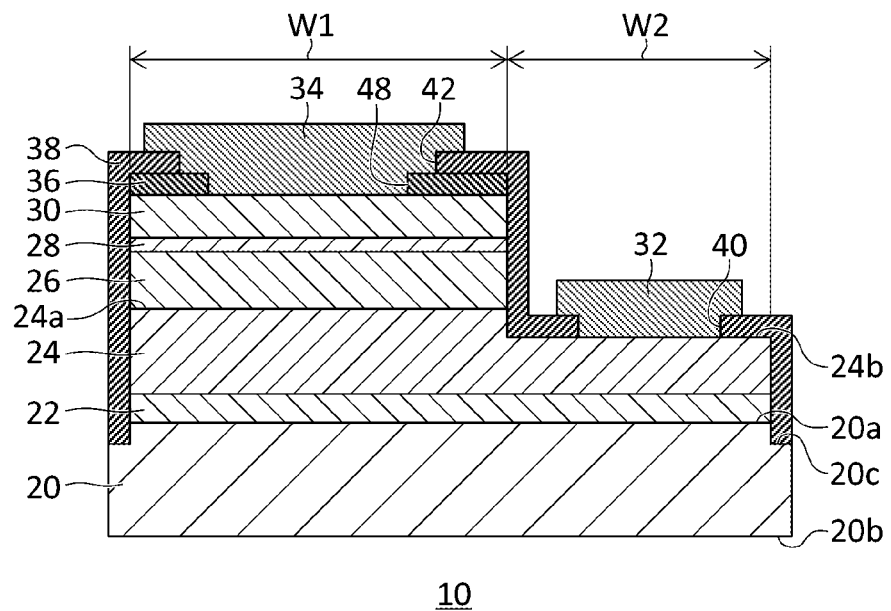
FIG. 1 is a cross-sectional view schematically showing a configuration of a semiconductor light emitting element according to an embodiment.

The invention will now be described by reference to the preferred embodiments. This does not intend to limit scope of the present invention, but to exemplify the invention.

A detailed description will be given of embodiments to practice the present invention with reference to the drawings. The same numerals are used in the description to denote the same elements and a duplicate description is omitted as appropriate. To facilitate the understanding, the relative dimensions of the constituting elements in the drawings do not necessarily mirror the relative dimensions in the actual light emitting element.

FIG. 1 is a cross-sectional view schematically showing a configuration of a semiconductor light emitting element 10 according to an embodiment. The semiconductor light emitting element 10 is a light emitting diode (LED) chip configured to emit "deep ultraviolet light" having a central wavelength of about 360 nm or shorter. To output deep ultraviolet light having such a wavelength, the semiconductor light emitting element 10 is made of an aluminum gallium nitride (AlGaN)-based semiconductor material having a band gap of about 3.4 eV or larger. The embodiment particularly shows a case of emitting deep ultraviolet light having a central wavelength A of about 240 nm-350 nm.

In this specification, the term "AlGaN-based semiconductor material" refers to a semiconductor material mainly containing aluminum nitride (AlN) and gallium nitride (GaN) and shall encompass a semiconductor material containing other materials such as indium nitride (InN). Therefore, "AlGaN-based semiconductor materials" as recited in this specification can be represented by a composition In$_{1-x-y}$Al$_x$Ga$_y$N (0≤x+y≤1, 0≤x≤1, 0≤y≤1). The AlGaN-based semiconductor material shall contain AlN, GaN, AlGaN, indium aluminum nitride (InAlN), indium gallium nitride (InGaN), or indium aluminum gallium nitride (InAlGaN).

Of "AlGaN-based semiconductor materials", those materials that do not substantially contain AlN may be distinguished by referring to them as "GaN-based semiconductor materials". "GaN-based semiconductor materials" mainly contain GaN or InGaN and encompass materials that additionally contain a slight amount of AlN. Similarly, of "AlGaN-based semiconductor materials", those materials that do not substantially contain GaN may be distinguished by referring to them as "AlN-based semiconductor materials". "AlN-based semiconductor materials" mainly contain AlN or InAlN and encompass materials that additionally contain a slight amount of GaN.

The semiconductor light emitting element 10 includes a substrate 20, a buffer layer 22, an n-type clad layer 24, an active layer 26, an electron block layer 28, a p-type clad layer 30, an n-side electrode 32, a p-side electrode 34, a first protective layer 36, and a second protective layer 38.

The substrate 20 is a substrate having translucency for the deep ultraviolet light emitted by the semiconductor light emitting element 10 and is, for example, a sapphire (Al$_2$O$_3$) substrate. The substrate 20 includes a first principal surface 20*a* and a second principal surface 20*b* opposite to the first principal surface 20*a*. The first principal surface 20*a* is a principal surface that is a crystal growth surface for growing the buffer layer 22 and the layers above. The second principal surface 20*b* is a principal surface that is a light extraction surface for extracting the deep ultraviolet light emitted by the active layer 26 outside. In one variation, the substrate 20 may be an aluminum nitride (AlN) substrate or an aluminum gallium nitride (AlGaN) substrate.

The buffer layer 22 is formed on the first principal surface 20*a* of the substrate 20. The buffer layer 22 is a foundation layer (template layer) to form the n-type clad layer 24 and the layers above. For example, the buffer layer 22 is an undoped AlN layer and is, specifically, an AlN (HT-AlN; High Temperature AlN) layer grown at a high temperature. The buffer layer 22 may include an undoped AlGaN layer formed on the AlN layer. In one variation, the buffer layer 22 may be comprised only of an undoped AlGaN layer in the case substrate 20 is an AlN substrate or an AlGaN substrate. In other words, the buffer layer 22 includes at least one of an undoped AlN layer and an AlGaN layer.

The n-type clad layer 24 is an n-type semiconductor layer formed on the buffer layer 22. The n-type clad layer 24 is an n-type AlGaN-based semiconductor material layer. For example, the n-type clad layer 24 is an AlGaN layer doped with silicon (Si) as an n-type impurity. The composition ratio of the n-type clad layer 24 is selected to transmit the deep ultraviolet light emitted by the active layer 26. For example, the n-type clad layer 24 is formed such that the molar fraction of AlN is 25% or higher, and, preferably, 40% or higher or 50% or higher. The n-type clad layer 24 has a band gap larger than the wavelength of the deep ultraviolet light emitted by the active layer 26. For example, the n-type clad layer 24 is formed to have a band gap of 4.3 eV or larger. It is preferable to form the n-type clad layer 24 such that the molar fraction of AlN is 80% or lower, i.e., the band gap is 5.5 eV or smaller. It is more preferable to form the n-type clad layer 24 such that the molar fraction of AlN is 70% or lower (i.e., the band gap is 5.2 eV or smaller). The n-type clad layer 24 has a thickness of about 1 µm-3 µm. For example, the n-type clad layer 24 has a thickness of about 2 µm.

The n-type clad layer 24 is formed such that the concentration of silicon (Si) as the impurity is not lower than $1 \times 10^{18}/cm^3$ and not higher than $5 \times 10^{19}/cm^3$. It is preferred to form the n-type clad layer 24 such that the Si concentration is not lower than $5 \times 10^{18}/cm^3$ and not higher than $3 \times 10^{19}/cm^3$, and it is preferred to form it such that the Si concentration is not lower than $7 \times 10^{18}/cm^3$ and not higher than $2 \times 10^{19}/cm^3$. In one example, the Si concentration in the n-type clad layer 24 is around $1 \times 10^{19}/cm^3$ and is in a range not lower than $8 \times 10^{18}/cm^3$ and not higher than $1.5 \times 10^{19}/cm^3$.

The active layer 26 is made of an AlGaN-based semiconductor material and has a double heterojunction structure by being sandwiched by the n-type clad layer 24 and the electron block layer 28. The active layer 26 may have a monolayer or multilayer quantum well structure. For example, the active layer 26 may be formed by stack of a barrier layer made of an undoped AlGaN-based semiconductor material and a well layer made of an undoped AlGaN-based semiconductor material. To output deep ultraviolet light having a wavelength of 355 nm or shorter, the active layer 26 is formed to have a band gap of 3.4 eV or larger. For example, the AlN composition ratio of the active layer 26 is selected so as to output deep ultraviolet light having a wavelength of 310 nm or shorter. The active layer 26 is not formed on a first top surface 24a of the n-type clad layer 24 and is not formed on a second top surface 24b adjacent to the first top surface 24a. The active layer 26 is not formed on the entirety of the n-type clad layer 24 and is formed only in a partial region (a first region W1) of the n-type clad layer 24.

The electron block layer 28 is formed on the active layer 26. The electron block layer 28 is an undoped AlGaN-based semiconductor material layer and is formed such that the molar fraction of AlN is 40% or higher, and, preferably, 50% or higher. The electron block layer 28 may be formed such that the molar fraction of AlN is 80% or higher or may be made of an AlN-based semiconductor material that does not substantially contain GaN. The electron block layer has a thickness of about nm-10 nm. For example, the electron block layer has a thickness of about 2 nm-5 nm. The electron block layer 28 may be a p-type AlGaN-based semiconductor material.

The p-type clad layer 30 is a p-type semiconductor layer formed on the electron block layer 28. The p-type clad layer 30 is a p-type AlGaN-based semiconductor material layer. For example, the p-type clad layer 30 is an AlGaN layer doped with magnesium (Mg) as a p-type impurity. The p-type clad layer 30 has a thickness of about 300 nm-700 nm. For example, the p-type clad layer 30 has a thickness of about 400 nm-600 nm. The p-type clad layer 30 may be made of a p-type GaIt-based semiconductor material that does not substantially contain AlN.

The first protective layer 36 is provided on the p-type clad layer 30. The first protective layer 36 is made of silicon oxide ($SiO_2$) or silicon oxynitride (SiON). The first protective layer 36 is made of a material having a lower reflectivity for the deep ultraviolet light output from the active layer 26 than the p-type clad layer 30. The refractive index of the AlGaN-based semiconductor material forming the p-type clad layer 30 depends on the composition ratio and is about 2.1-2.56. Meanwhile, the refractive index of $SiO_2$ forming the first protective layer 36 is about 1.4, and the refractive index of SiON is about 1.4-2.1. By providing the first protective layer 36 having a low refractive index, a relatively large portion of the ultraviolet light from the active layer 26 is totally reflected at the interface between the p-type clad layer 30 and the first protective layer 36 and guided toward the second principal surface 20b of the substrate 20 that is the light extraction surface. In the case of $SiO_2$, in particular, the refractive index difference from the p-type clad layer 30 is larger so that the reflection characteristic is further improved. The thickness of the first protective layer 36 is 50 nm or larger and may be, for example, 100 nm or larger.

A first p-side opening 48 for forming the p-side electrode 34 is provided in the first protective layer 36. The first p-side opening 48 is provided on the p-type clad layer 30 and is formed to extend through the first protective layer 36 to expose the p-type clad layer 30.

The second protective layer 38 is provided to cover the top of the first protective layer 36, the top of the second top surface 24b of the n-type clad layer 24, and the lateral surfaces of the n-type clad layer 24, the active layer 26, and the electron block layer 28. As illustrated, the second protective layer 38 may cover a portion of each of the lateral surfaces of the buffer layer 22 and the lateral surface of the substrate 20. The second protective layer 38 is made of aluminum oxide ($Al_2O_3$), aluminum oxynitride (AlON), or aluminum nitride (AlN). Aluminum oxide ($Al_2O_3$), aluminum oxynitride (AlON), and aluminum nitride (AlN) for forming the second protective layer 38 has more excellent moisture resistance than silicon oxide ($SiO_2$) or silicon oxynitride (SiON) for forming the first protective layer 36. Therefore, the protective function that is excellent in moisture resistance is provided by covering the entirety of the top surface and the lateral surface of the element structure with the second protective layer 38. The thickness of the second protective layer 38 can be 50 nm or smaller and, for example, about 10 nm-30 nm.

An n-side opening 40 for forming the n-side electrode 32 is provided in the second protective layer 38. The n-side opening 40 is provided on the second top surface 24b of the n-type clad layer 24 and is formed to extend through the second protective layer 38 to expose the n-type clad layer 24. A second p-side opening 42 for forming the p-side electrode 34 is provided in the second protective layer 38. The second p-side opening 42 is provided on the p-type clad layer 30 or the first protective layer 36 and is formed to extend through the second protective layer 38 to expose the first protective layer 36 or the p-type clad layer 30.

The n-side electrode 32 is provided in the n-side opening 40 and is formed contiguously on the second top surface 24b of the n-type clad layer 24. The n-side electrode 32 is a Ti/Al-based electrode and includes at least a Ti layer provided contiguously on the n-type clad layer 24 and an Al layer provided contiguously on the Ti layer. The thickness of the Ti layer is about 1 nm-10 nm, and the thickness of the Al layer is about 20 nm-1000 nm. The n-side electrode 32 also functions as a reflective electrode that reflects the deep ultraviolet light from the n-type clad layer 24 and guides it toward the second principal surface 20b of the substrate 20.

A portion of the n-side electrode 32 is also formed on the second protective layer 38 in the second region W2. Forming the n-side electrode 32 not only in the n-side opening 40 but also on the second protective layer 38 increases the area in which the reflective electrode is formed and reflects more ultraviolet light toward the second principal surface 20b of the substrate 20 that is the light extraction surface. Further, forming the n-side electrode 32 to cover the entirety of the n-side opening 40 enhances the sealing function provided by the combination with the second protective layer 38.

The p-side electrode 34 is provided in the first p-side opening 48 and the second p-side opening 42 and is formed contiguously on the p-type clad layer 30. The p-side electrode 34 is made of a conductive oxide such as an indium tin oxide (ITO). The p-side electrode 34 may be a metal electrode. For example, the p-side electrode 34 may be formed by a nickel (Ni)/gold (Au) stack structure.

A portion of the p-side electrode 34 is also formed on the first protective layer 36 and the second protective layer 38 in the first region W1. Forming the p-side electrode 34 to cover the entirety of the first p-side opening 48 and the second p-side opening 42 enhances the sealing function provided by the combination with the second protective layer 38.

Figure 2:
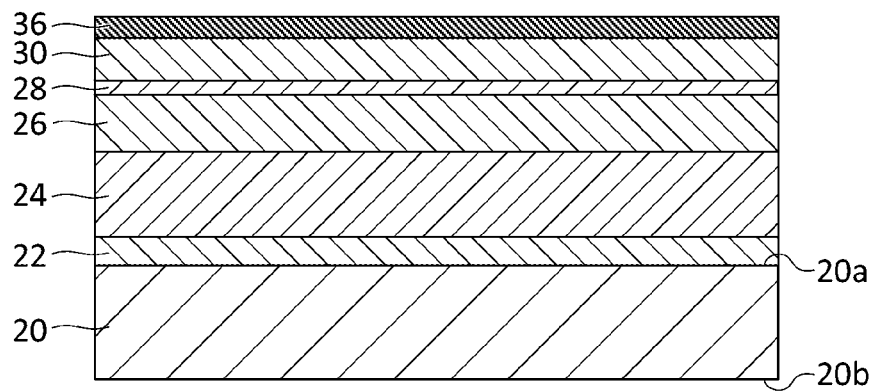
FIG. 2 schematically shows a step of manufacturing the semiconductor light emitting element.

A description will now be given of a method of manufacturing the semiconductor light emitting element 10. FIGS. 2-8 schematically show steps of manufacturing the semiconductor light emitting element 10. First, as shown in FIG. 2, the buffer layer 22, the n-type clad layer 24, the active layer 26, the electron block layer 28, the p-type clad layer 30, and the first protective layer 36 are formed on the first principal surface 20a of the substrate 20 successively.

The substrate 20 is a sapphire ($Al_2O$) substrate and is a growth substrate for forming an AlGaN-based semiconductor material. For example, the buffer layer 22 is formed on the (0001) plane of the sapphire substrate. The buffer layer 22 includes, for example, an AlN (HT-AlN) layer grown at a high temperature and an undoped AlGaN (u-AlGaN) layer. The n-type clad layer 24, the active layer 26, the electron block layer 28, and the p-type clad layer 30 are layers made of an AlGaN-based semiconductor material, an AlN-based semiconductor material, or a GaN-based semiconductor material and can be formed by a well-known epitaxial growth method such as the metalorganic vapor phase epitaxy (MOVPE) method and the molecular beam epitaxial (MBE) method. The first protective layer 36 is made of $SiO_2$ or SiON and can be formed by a well-known technology such as chemical vapor deposition (CVD). The thickness of the first protective layer 36 is 50 nm or larger and, for example, 100 nm or larger.

Figure 3:
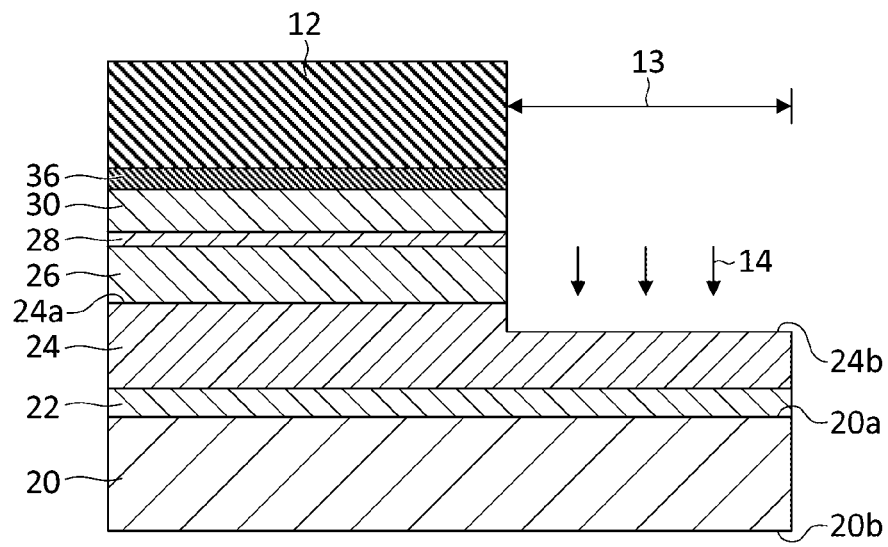
FIG. 3 schematically shows a step of manufacturing the semiconductor light emitting element.

Subsequently, as shown in FIG. 3, a mask 12 is formed on the first protective layer 36. A portion of each of the first protective layer 36, the p-type clad layer 30, electron block layer 28, the active layer 26, and the n-type clad layer 24 in an exposed region 13, in which the mask 12 is not formed, is removed. This forms the second top surface 24b (exposed surface) of the n-type clad layer 24 in the exposed region 13. In the step of forming the exposed surface of the n-type clad layer 24, the layers can be removed by dry etching 14. For example, reactive ion etching using an etching gas turned into plasma can be used. For example, inductively coupled plasma (ICP) etching can be used.

Figure 4:
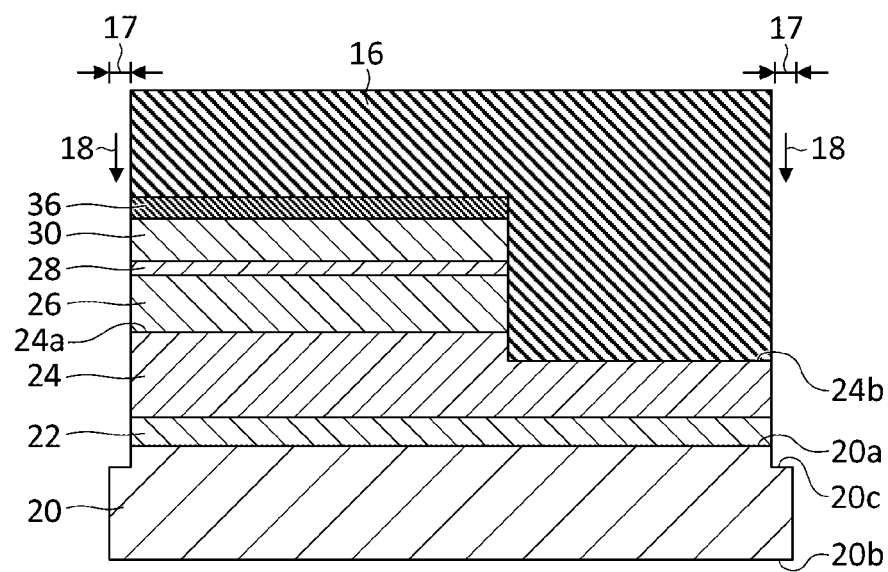
FIG. 4 schematically shows a step of manufacturing the semiconductor light emitting element.

Subsequently, as shown in FIG. 4, another mask 16 is formed on the first protective layer 36 and on the second top surface 24b of the n-type clad layer 24. Subsequently, the first protective layer 36, the p-type clad layer 30, the electron block layer 28, the active layer 26, and the n-type clad layer 24 in an outer circumferential region 17, in which the mask 16 is not formed, are removed by dry etching 18. The outer circumferential region 17 is a region for providing isolation between elements in the case that a plurality of light emitting elements is formed on one substrate. In the outer circumferential region 17, the buffer layer 22 may be removed in part, or the buffer layer 22 may be completely removed to expose the substrate 20. In the outer circumferential region 17, a portion of the substrate 20 may be removed to expose an outer circumferential region 20c of substrate having a height different from the first principal surface 20a.

Figure 5:
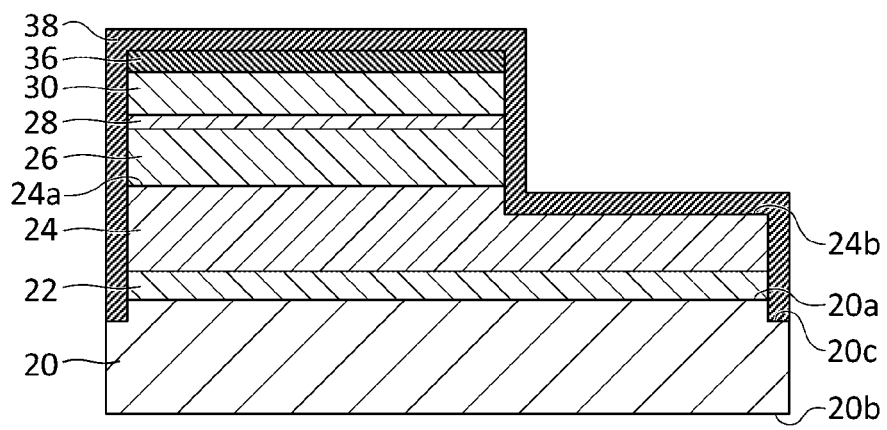
FIG. 5 schematically shows a step of manufacturing the semiconductor light emitting element.

Subsequently, after removing the mask 16, the second protective layer 38 is formed as shown in FIG. 5 to cover the entirety of the top surface of the element structure. The second protective layer 38 is made of $Al_2O_3$, AlON, or AlN. The second protective layer 38 is provided to cover the top of the first protective layer 36, the top of the second top surface 24b of the n-type clad layer 24, and the lateral surfaces of the n-type clad layer 24, the active layer 26, the electron block layer 28, and the p-type clad layer 30. The first protective layer 36 may cover the lateral surface of buffer layer 22 and cover at least a portion of the lateral surface of the substrate 20.

The second protective layer 38 is contiguous with the lateral surface of the active layer 26 to protect the active layer 26. The second protective layer 38 preferably has an excellent moisture resistance and preferably has a dense structure having a high film density. The second protective layer 38 having an excellent protective function is formed by forming the second protective layer 38 by using atomic layer deposition (ALD) method. Forming the second protective layer 38 using the ALD method reduces the film thickness necessary and sufficient for the protective function. The thickness of the second protective layer 38 can be 50 nm or smaller and, for example, about 10 nm-30 nm.

Figure 6:
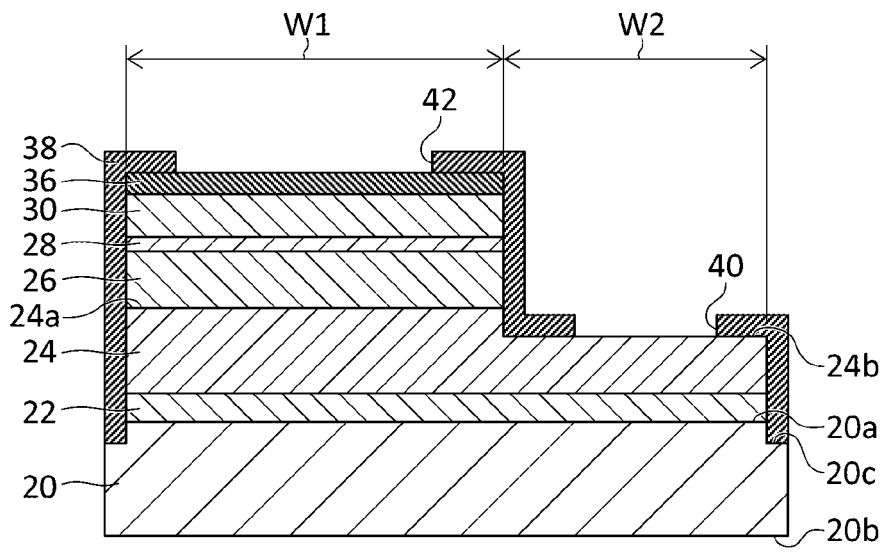
FIG. 6 schematically shows a step of manufacturing the semiconductor light emitting element.

Subsequently, as shown in FIG. 6, the n-side opening 40 and the p-side opening (the second p-side opening) 42 are formed in the second protective layer 38. The n-side opening 40 is provided in a partial region of the second region W2 on the second top surface 24b of the n-type clad layer 24, and the second p-side opening 42 is provided in a partial region of the first region W1 on the first protective layer 36. The n-side opening 40 and the second p-side opening 42 can be formed by forming a mask outside the regions of these openings and dry-etching the second protective layer 38. The n-side opening 40 and the second p-side opening 42 are formed to extend through the second protective layer 38. Accordingly, the second top surface 24b of the n-type clad layer 24 is exposed in the n-side opening 40, and the first protective layer 36 is exposed in the second p-side opening 42.

It is preferred to remove the second protective layer 38 so as not to expose the p-type clad layer 30 when the second p-side opening 42 is formed. It is therefore preferred that the first protective layer 36 remains on the p-type clad layer 30 and the entirety of the p-type clad layer 30 remains to be covered by the first protective layer 36, after the second p-side opening 42 is formed.

Figure 7:
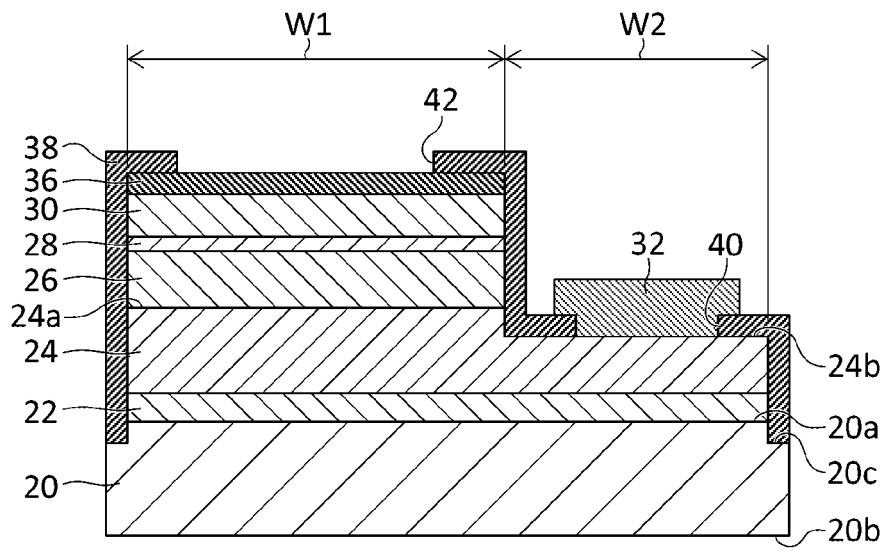
FIG. 7 schematically shows a step of manufacturing the semiconductor light emitting element.

Subsequently, as shown in FIG. 7, the n-side electrode 32 is formed in the n-side opening 40. The n-side electrode 32 can be formed by forming the Ti layer on the second top surface 24b of the n-type clad layer 24 exposed in the n-side opening 40 and then forming the Al layer on the Ti layer. It is preferred to form the Ti/Al layers of the n-side electrode 32 by sputtering. These layers can be formed by electron beam deposition, but sputtering can form a metal layer having a low film density and realize a suitable contact resistance at a relatively low anneal temperature.

The n-side electrode 32 may be formed not only inside the n-side opening 40 but also outside the n-side opening 40. In other words, a portion of the n-side electrode may be formed on the second protective layer 38 in the second region W2. By ensuring that the area in which the n-side electrode 32 is wider than the n-side opening, the area covered by the n-side electrode 32, which functions as a reflection electrode, is enlarged, and the output characteristics are improved. Also, the entirety of the n-side opening 40 is covered with the n-side electrode 32 so that the sealing function is enhanced.

The n-side electrode 32 is then annealed. The n-side electrode 32 is annealed at a temperature below the melting point of Al (about 660° C.). It is preferred to anneal the n-side electrode 32 at a temperature not lower than 560° C. and not higher than 650° C. The film density of the Al layer of less than 2.7 g/cm$^3$ and the anneal temperature of not lower than 560° C. and not higher than 650° C. ensures that the contact resistance of the n-side electrode 32 is 0.1 Ω-cm$^2$ or lower. The anneal temperature of not lower than 560° C. and not higher than 650° C. enhances the post-annealing flatness of the n-side electrode 32 and provides an ultraviolet reflectivity of 30% or higher. Further, a suitable contact resistance is obtained even when annealing is performed for one minute or longer (e.g., about five minutes-thirty minutes) by annealing at a temperature below the melting point of Al. In the case a plurality of element portions is formed on one substrate, securing a long anneal time (one minute or more) makes it possible to enhance temperature uniformity in the substrate during annealing to allow a plurality of semiconductor light emitting elements with little characteristic variation to be formed at the same time.

Figure 8:
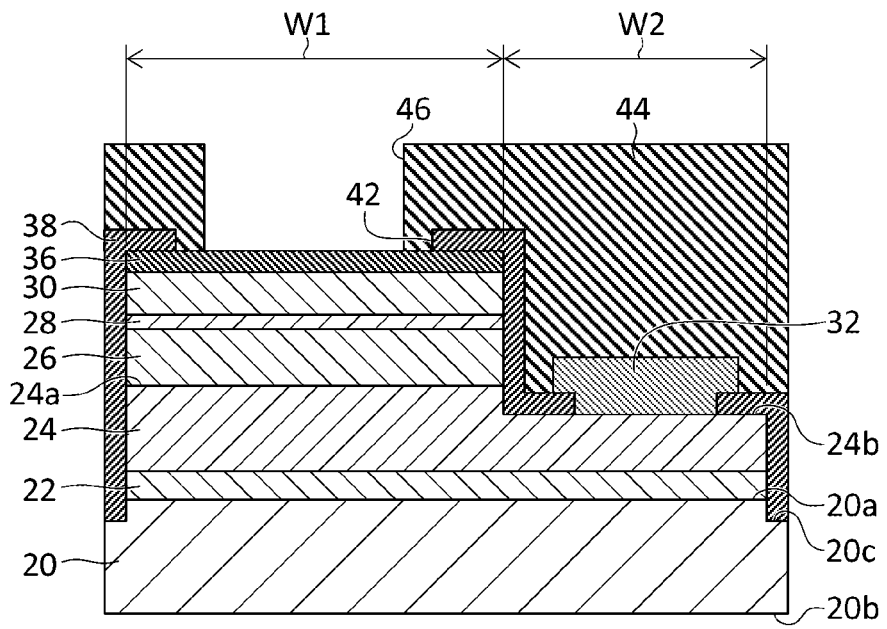
FIG. 8 schematically shows a step of manufacturing the semiconductor light emitting element.

Subsequently, as shown in FIG. 8, a mask 44 is formed to extend on the first protective layer 36 and the second protective layer 38 in the first region W1 and on the first protective layer 36 and the n-side electrode 32 in the second region W2. The mask 44 has an opening 46 at a position corresponding to the second p-side opening 42 of the second protective layer 38 in the first region W1. The opening 46 of the mask 44 is provided to form the first p-side opening 48 extending through the first protective layer 36 and is positioned inward of the second p-side opening 42 of the second protective layer 38. Therefore, the lateral surfaces of the second protective layer 38 in the second p-side opening 42 are covered by the mask 44.

Figure 9:
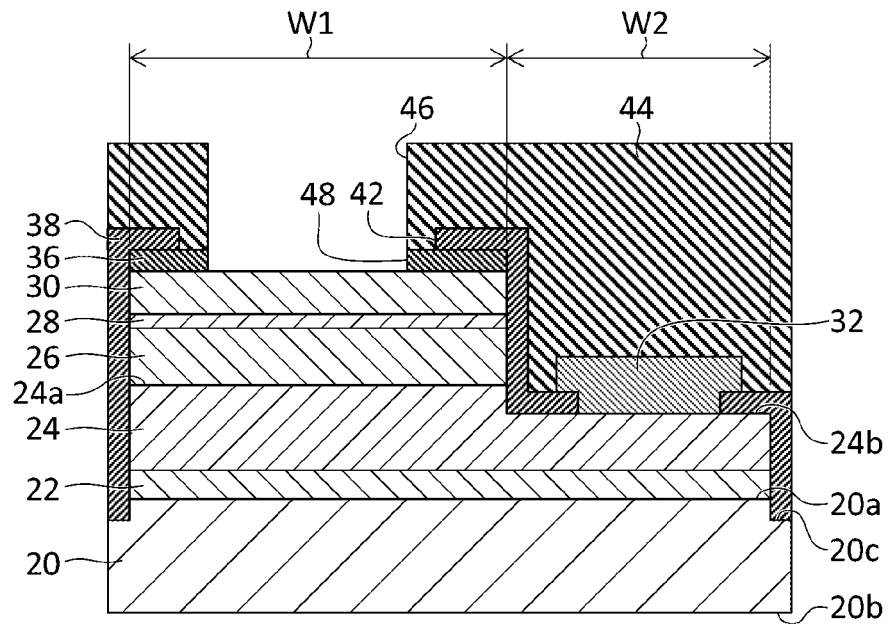
FIG. 9 schematically shows a step of manufacturing the semiconductor light emitting element.

Subsequently, as shown in FIG. 9, the first protective layer 36 in the opening 46 of the mask 44 is removed to form the first p-side opening 48 in the first protective layer 36. The first p-side opening 48 is formed to extend through the first protective layer 36, and the first protective layer 36 is removed so as to expose the p-type clad layer 30 in the first p-side opening 48. It is preferred that the first protective layer 36 is removed by wet etching. The first protective layer 36 can be removed by using, for example, buffered hydrofluoric acid (BHF) that is a liquid containing a mixture of hydrofluoric acid (HF) and ammonium fluoride (NH$_4$F). Wet-etching of the first protective layer 36 reduces a damage impact on the p-type clad layer 30 exposed after the first protective layer 36 is removed as compared to the case of dry etching.

Subsequently, after removing the mask 44, the p-side electrode 34 is formed in the first p-side opening 48 and the second p-side opening 42. The p-side electrode 34 is provided contiguously on the p-type clad layer 30 exposed in the first p-side opening 48. A portion of the p-side electrode 34 is also formed on the first protective layer 36 exposed in the second p-side opening 42 and is also formed on the second protective layer 38. This allows the entirety of the first p-side opening 48 and the second p-side opening 42 to be covered by the p-side electrode 34. The semiconductor light emitting element 10 shown in FIG. 1 is completed through the steps described above.

Figure 10:
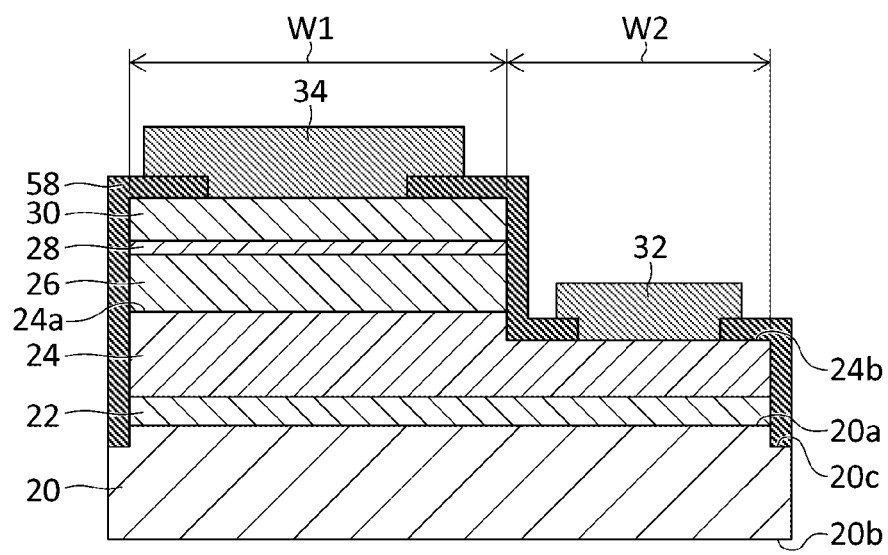
FIG. 10 is a cross-sectional view schematically showing a configuration of a semiconductor light emitting element according to the comparative example.

A description will now be given of the function and advantage of the embodiment with reference to a comparative example. FIG. 10 schematically shows a configuration of a semiconductor light emitting element 60 according to the comparative example. In the comparative example, only a protective layer 58 like the second protective layer 38 described above is provided, and the first protective layer 36 is not provided. The protective layer 58 of the comparative example is provided on the p-type clad layer 30 in the first region W1, on the n-type clad layer 24 in the second region W2, and contiguous with the lateral surfaces of the n-type clad layer 24, the active layer 26, the electron block layer 28, and the p-type clad layer 30.

In the case the protective layer 58 contains silicon (Si) in the comparative example, i.e., in the case the protective layer 58 is made of SiO$_2$, SiON, silicon nitride (SiN$_x$), or the like, Si contained in the protective layer 58 may be diffused in the active layer 26 when the semiconductor light emitting element 60 is powered for use. Diffusion of Si in the active layer 26 may turn the AlGaN-based semiconductor material forming the active layer 26 into an n-type element and cause the output characteristics of the active layer 26 to become poor. Moreover, silicon nitride absorbs the ultraviolet light output from the active layer 26, which may cause the light output from the second principal surface 20b (the light extraction surface) of the substrate to become poor.

When the protective layer 58 is made of Al$_2$O$_3$, AlON, or AlN in the comparative example, the protective layer 58 would not contain Si so that the impact from diffusion of Si in the active layer 26 occurring when the semiconductor light emitting element 60 is powered for use is prevented. However, an oxynitride of aluminum is difficult to wet-etch so that protective layer 58 needs to be dry-etched when forming the p-side opening to expose the p-type clad layer 30. It is practically impossible to remove only the protective layer 58 by dry etching. The top surface of the p-type clad layer 30 is dry-etched at least in part. This results in a damage impact remaining in p-type clad layer 30 contiguous with the p-side electrode 34 so that the contact resistance of the p-side electrode 34 can be increased. This may cause the light output of the semiconductor light emitting element 60 to be decreased.

Meanwhile, according to the embodiment, the lateral surface of the active layer 26 is covered by the second protective layer 38 made of Al$_2$O$_3$, AlON, or AlN so that the impact from diffusion of Si in the active layer 26 is prevented. The second protective layer 38 made of Al$_2$O$_3$, AlON, or AlN has an excellent moisture resistance and so enhances the function of sealing the active layer 26. Further, since the first protective layer 36 made of SiO$_2$ or SiON is provided on the p-type clad layer 30, the first protective layer 36 can be made to function as a stop layer when dry-etching the second protective layer 38. This prevents the exposed surface of the p-type clad layer 30 from being damaged by dry etching. This prevents the contact resistance of the p-side electrode 34 from being increased and improves the light output of semiconductor light emitting element 10.

Using SiO$_2$, a material having a low refractive index (1.4), for the first protective layer 36 according to the embodiment enlarges a refraction index difference from the p-type clad layer 30 and allows more ultraviolet light incident on the interface between the p-type clad layer 30 and the first protective layer 36 to be totally reflected. This can guide more of the ultraviolet light output from the active layer 26 toward the second principal surface 20b of the substrate 20 that is the light extraction surface and improve the light output of the semiconductor light emitting element 10 accordingly.

Described above is an explanation based on an exemplary embodiment. The embodiment is intended to be illustrative only and it will be understood by those skilled in the art that various design changes are possible and various modifications are possible and that such modifications are also within the scope of the present invention.

Figure 11:
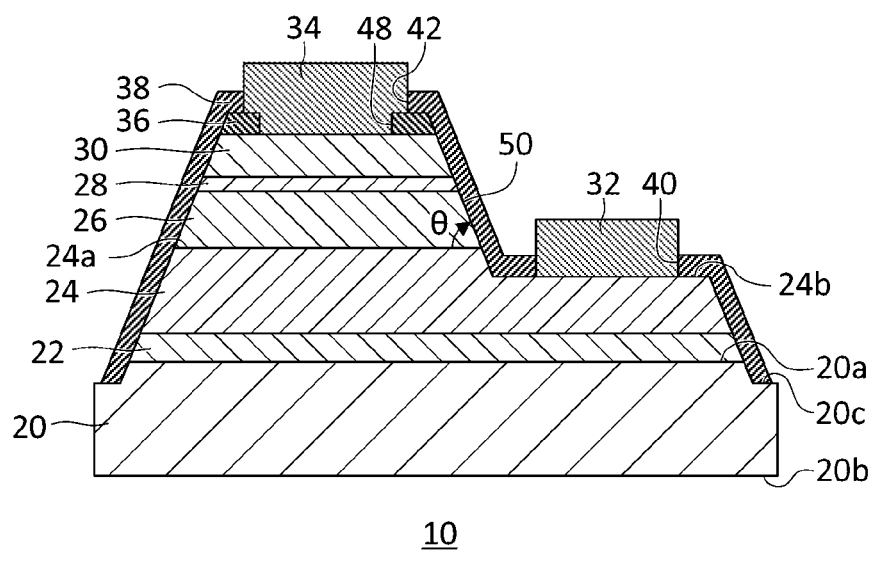
FIG. 11 is a cross-sectional view schematically showing a configuration of the semiconductor light emitting element 10 according to a variation.

FIG. 11 is a cross-sectional view schematically showing a configuration of the semiconductor light emitting element 10 according to a variation. The variation differs from the embodiment described above in that a lateral surface 50 of the semiconductor layers covered by the second protective layer 38 is a sloped mesa surface. The slope angle θ of the lateral surface 50 of the semiconductor layers is, for example, 60° or smaller, and can be, for example, about 15°-50°. According to the variation, the sloped mesa surface of the active layer 26 reflects the ultraviolet light emitted from the active layer 26 in the horizontal direction toward the second principal surface 20b of the substrate 20 so that the light extraction efficiency is increased.

In order to manufacture the semiconductor light emitting element 10 according to the variation, the lateral surfaces of the masks 12 and 16 used in the steps of FIG. 3 and may described above be sloped. In this variation, the semiconductor layers are etched to form the mesa surface after the first protective layer 36 is formed so that a sloped lateral surface is also formed in the first protective layer 36.

In another variation, a further protective layer may be provided addition to the first protective layer 36 and the second protective layer 38 described above. For example, a third protective layer that covers the top surfaces and the lateral surfaces of the n-side electrode 32, the p-side electrode 34, and the second protective layer 38 may be provided. The third protective layer may be made of a material similar to that of the first protective layer 36 or made of a material similar to that of the second protective layer 38. The third protective layer may be stack structure of a plurality of layers made of different materials.

It should be understood that the invention is not limited to the above-described embodiment but may be modified into various forms on the basis of the spirit of the invention. Additionally, the modifications are included in the scope of the invention.

What is claimed is:

1. A semiconductor light emitting element comprising:
an n-type semiconductor layer provided on a substrate and made of an n-type aluminum gallium nitride (AlGaN)-based semiconductor material;
an active layer provided in a first region on the n-type semiconductor layer and made of an AlGaN-based semiconductor material;
a p-type semiconductor layer provided on the active layer and made of a p-type AlGaN-based semiconductor material;
a first protective layer provided on the p-type semiconductor layer and made of silicon oxide ($SiO_2$) or silicon oxynitride (SiON);
a second protective layer provided to cover a top of the first protective layer, a second region on the n-type semiconductor layer different from the first region, and a lateral surface of the active layer, wherein the second protective layer is made of aluminum oxide ($Al_2O_3$), aluminum oxynitride (AlON), or aluminum nitride (AlN);
a p-side electrode provided contiguously on the p-type semiconductor layer in a p-side opening that extends through the first protective layer and the second protective layer on the p-type semiconductor layer; and
an n-side electrode provided contiguously on the n-type semiconductor layer in an n-side opening that extends through the second protective layer in the second region on the n-type semiconductor layer,
wherein the first protective layer does not cover the second region on the n-type semiconductor layer, and the first protective layer does not cover the lateral surface of the active layer.

2. The semiconductor light emitting element according to claim 1, wherein
the second protective layer is provided to further cover lateral surfaces of the n-type semiconductor layer and the p-type semiconductor layer.

3. The semiconductor light emitting element according to claim 1, wherein
a thickness of the second protective layer is 50 nm or smaller.

4. The semiconductor light emitting element according to claim 1, wherein
a portion of each of the n-side electrode and the p-side electrode is provided on the second protective layer.

5. A method of manufacturing a semiconductor light emitting element comprising:
stacking an n-type semiconductor layer made of an n-type aluminum gallium nitride (AlGaN)-based semiconductor material, an active layer provided on the n-type semiconductor layer and made of an AlGaN-based semiconductor material, a p-type semiconductor layer provided on the active layer and made of a p-type AlGaN-based semiconductor material, and a first protective layer provided on the p-type semiconductor layer and made of silicon oxide ($SiO_2$) or silicon oxynitride (SiON) successively on a substrate;
removing a portion of each of the first protective layer, the p-type semiconductor layer, the active layer, and the n-type semiconductor layer so as to expose a portion of the n-type semiconductor layer;
forming a second protective layer made of aluminum oxide ($Al_2O_3$), aluminum oxynitride (AlON), or aluminum nitride (AlN) so as to cover a top of the first protective layer, an exposed region on the n-type semiconductor layer, and a lateral surface of the active layer;
forming a p-side opening in which the first protective layer is exposed by removing the second protective layer on the first protective layer in part, and forming an n-side opening in which the n-type semiconductor layer is exposed by removing the second protective layer on the n-type semiconductor layer in part;
forming an n-side electrode contiguously on the n-type semiconductor layer in the n-side opening;
exposing the p-type semiconductor layer by removing the first protective layer in the p-side opening; and
forming a p-side electrode contiguous on the p-type semiconductor layer in the p-side opening, wherein the active layer is provided in a first region on the n-type semiconductor layer, the second protective layer is provided to cover the top of the first protective layer, a second region on the n-type semiconductor layer different from the first region, and the lateral surface of the active layer, the p-side electrode is provided contiguously on the p-type semiconductor layer in the p-side opening that extends through the first protective layer and the second protective layer on the p-type semiconductor layer, the n-side electrode is provided contiguously on the n-type semiconductor layer in the n-side opening that extends through the second protective layer in the second region on the n-type semiconductor layer, the first protective layer does not cover the second region on the n-type semiconductor layer, and the first protective layer does not cover the lateral surface of the active layer.

6. The method of manufacturing a semiconductor light emitting element according to claim 5, wherein
the forming of the p-side opening and the n-side opening includes removing the second protective layer by dry etching, and
the exposing of the p-type semiconductor layer includes removing the first protective layer by wet etching.

7. The method of manufacturing a semiconductor light emitting element according to claim 5, wherein
the second protective layer is formed by using atomic layer deposition method.

\* \* \* \* \*